(12) United States Patent
Metz

(10) Patent No.: US 7,271,621 B2
(45) Date of Patent: Sep. 18, 2007

(54) METHOD AND APPARATUS FOR TRIMMING A PHASE DETECTOR IN A DELAY-LOCKED-LOOP

(75) Inventor: Peter C. Metz, Macungie, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 11/239,916

(22) Filed: Sep. 30, 2005

(65) Prior Publication Data

US 2007/0075756 A1   Apr. 5, 2007

(51) Int. Cl.
  *G01R 25/00*   (2006.01)
(52) U.S. Cl. ............................................. 327/3; 327/12
(58) Field of Classification Search ...................... None
  See application file for complete search history.

(56) References Cited

U.S. PATENT DOCUMENTS

| | | | |
|---|---|---|---|
| 6,998,889 B2 * | 2/2006 | Best | 327/157 |
| 7,057,418 B1 * | 6/2006 | Fu et al. | 327/3 |
| 7,102,402 B2 * | 9/2006 | Kurd et al. | 327/158 |

* cited by examiner

*Primary Examiner*—Cassandra Cox

(57) ABSTRACT

Methods and apparatus are provided for trimming a phase detector in a delay-locked-loop. A latch that evaluates a phase offset between two signals is trimmed by applying two signals to the latch that are substantially phase aligned; obtaining a phase offset between the two signals measured by the latch; and adjusting a trim setting of one or more buffers associated with the two signals until the phase offset satisfies one or more predefined criteria. The two signals can be a clock signal and an inverted version of the clock signal. The two signals can be a source of phase aligned data generated from a single clock source.

20 Claims, 5 Drawing Sheets

METHOD AND APPARATUS FOR TRIMMING A PHASE DETECTOR IN A DELAY-LOCKED-LOOP

FIELD OF THE INVENTION

The present invention is related to techniques for controlling the phase of one or more clock signals and, more particularly, to techniques for trimming a phase detector in a Delay-Locked-Loop.

BACKGROUND OF THE INVENTION

In many applications, including clock recovery applications, it is often necessary to compare and control the phase of one or more clock signals. For example, in one common type of analog Clock and Data Recovery system (CDR), the phase of the input data is compared to the phase of two or more sampling clocks. The sampling clocks may be generated, for example, from a fixed reference clock by a Delay-Locked-Loop (DLL). A DLL is a control loop, separate from the primary CDR control loop, that acts to control the spacing between the sampling clocks. The DLL develops a set of phases that are "selected" and interpolated by the CDR control loop to obtain the correct phase required to match-up with the incoming data transition phase.

Typically, a phase detector in the DLL determines the phase difference between adjacent rising edges of two delayed clock signals. If the phase detector detects a phase lag between the rising edges, the phase detector generates a downward control signal, indicating an extent of the phase lag. Likewise, if the phase detector detects a phase lead between the rising edges, the phase detector generates an upward control signal, indicating an extent of the phase lead. The upward and downward control signals are typically applied to a charge pump that generates a positive or negative current pulse having a pulse width that is proportional to the phase difference. Thereafter, the current pulse generated by the charge pump is typically integrated by a loop filter, such as a capacitor. The capacitor voltage is then applied to the bias voltage generator which provides the VCDL control voltages. The VCDL control voltages then change to raise or lower the delay of each delay cell within the VCDL.

While such DLL circuits effectively generate the sampling clocks, they suffer from a number of limitations, which if overcome, could further improve the utility and accuracy of such DLLs. For example, when the DLLs are implemented using integrated circuit technology, and the phase detector is implemented as a D-type flip flop, a set-up/hold time offset is introduced into the phase difference detection.

U.S. patent application Ser. No. 11/020,022, entitled, "Trimming Method and Apparatus for Voltage Controlled Delay Loop with Central Interpolator," discloses methods and apparatus for trimming a desired delay element in a voltage controlled delay loop (ensures that the delay provided by each delay element in the VCDL loop are the same). U.S. patent application Ser. No. 11/141,703, entitled, "Parallel Trimming Method and Apparatus for a Voltage Controlled Delay Loop," discloses a parallel trimming method and apparatus for a voltage controlled delay loop (trims the latch buffer associated with each delay element).

A need exists for a trimming method and apparatus for a phase detector in a DLL. A further need exists for a method and apparatus for trimming a phase offset in a phase detector of a DLL to approximately zero.

SUMMARY OF THE INVENTION

Generally, methods and apparatus are provided for trimming a phase detector in a delay-locked-loop. According to one aspect of the invention, a latch that evaluates a phase offset between two signals is trimmed by applying two signals to the latch that are substantially phase aligned; obtaining a phase offset between the two signals measured by the latch; and adjusting a trim setting of one or more buffers associated with the two signals until the phase offset satisfies one or more predefined criteria. The latch can be part of a phase detector in a delay-locked loop.

In one exemplary implementation, the two signals are a clock signal and an inverted version of the clock signal. The two signals can be a source of phase aligned data generated from a single clock source, such as a central interpolator in a clock and data recovery circuit. The source of phase aligned data can be obtained, for example, by aligning one or more edges of signals generated by delay elements that are 180 degrees out of phase.

A more complete understanding of the present invention, as well as further features and advantages of the present invention, will be obtained by reference to the following detailed description and drawings.

DETAILED DESCRIPTION

Figure 1:
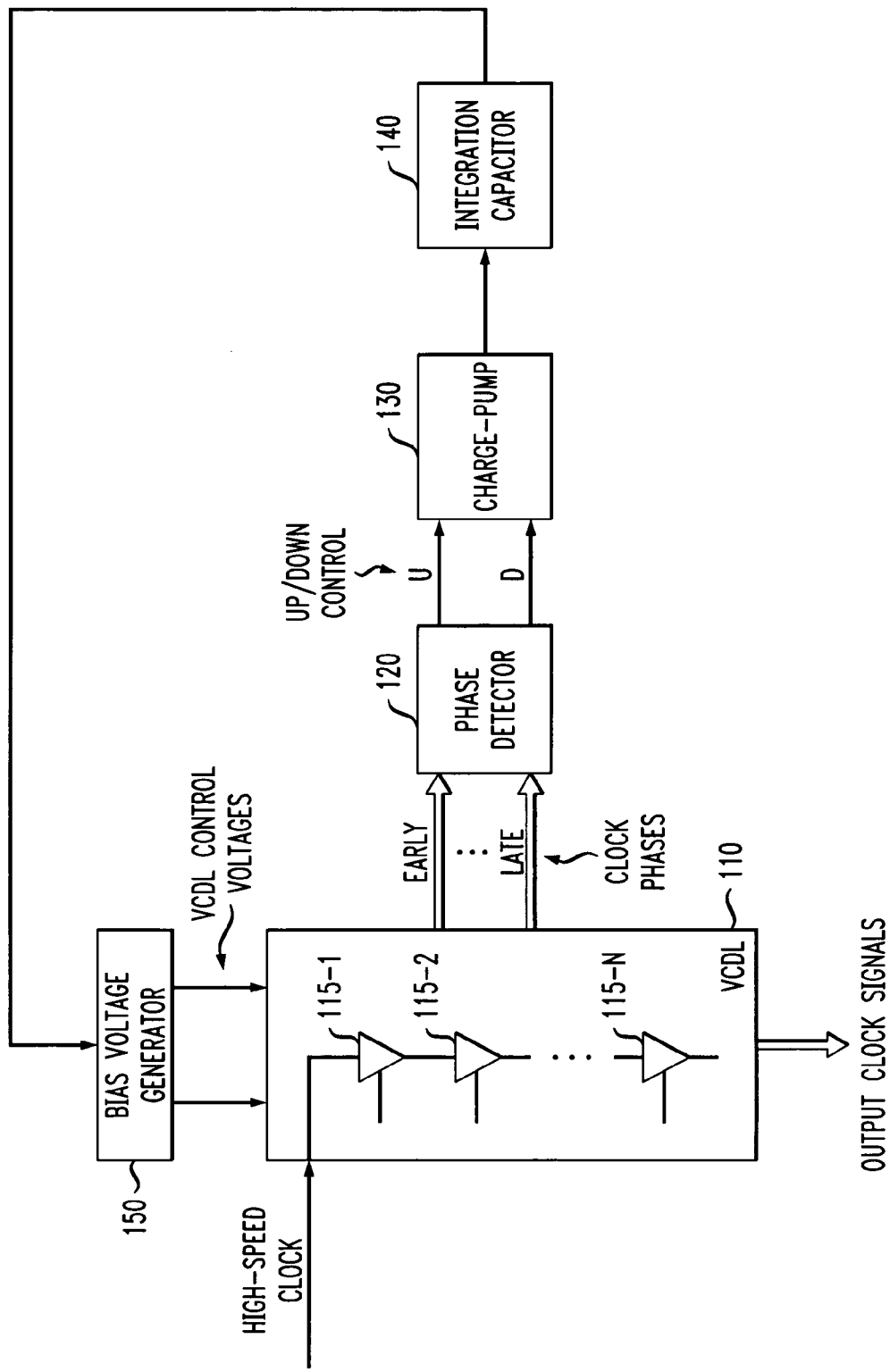
FIG. 1 illustrates a conventional DLL circuit.

FIG. 1 illustrates a conventional DLL circuit 100. As shown in FIG. 1, the DLL circuit 100 comprises a voltage controlled delay line (VCDL) 110, a phase detector 120, a charge pump 130, an integration capacitor 140 and a bias voltage generator 150. The voltage controlled delay line 110 can be embodied, for example, using the VCDL circuits described in U.S. patent application Ser. No. 10/999,900, filed Nov. 30, 2004, entitled, "Voltage Controlled Delay Loop and Method with Injection Point Control," incorporated by reference herein.

As shown in the exemplary embodiment of FIG. 1, a voltage controlled delay line 110 is typically comprised of a cascaded chain of delay elements 115-1 through 115-N, hereinafter, collectively referred to as delay elements 115, each having a nominal delay value that is controlled by an input voltage or current, to produce a plurality of phase shifted clock signals, such as the "early" and "late" clock signals shown in FIG. 1, as well as a plurality of output clock signals (used for CDR).

Generally, the phase detector 120 determines the phase difference between falling edges of the early clock signals and rising edges of the late clock signals generated by the voltage controlled delay line 110. If the phase detector 120 detects that the phase of the late clock lags the phase of the early clock, the phase detector 120 generates a downward control signal, D, the magnitude of which is proportional to the phase lag. Likewise, if the phase detector 120 detects that the phase of the late clock leads the phase of the early clock, the phase detector 120 generates an upward control signal, U, the magnitude of which is proportional to the phase lead.

The charge pump 130 generates a positive or negative current pulse having a pulse width that is proportional to the phase difference. As shown in FIG. 1, the current pulse generated by the charge pump 130 is integrated by a loop filter, such as a capacitor 140, in a known manner. As previously indicated, the pulse width of the current generated by the charge pump 130 is proportional to the phase difference. Thus, the pulse width must get progressively smaller as the phase difference is reduced. The capacitor voltage is then applied to the bias voltage generator 150, which provides the VCDL control voltages. The VCDL control voltages then change to raise or lower the delay of each delay cell within the VCDL.

For a detailed discussion of an alternate DLL circuit, see, for example, U.S. patent application Ser. No. 11/221,387, entitled "Method And Apparatus For Sigma-Delta Delay Control In A Delay-Locked-Loop," incorporated by reference herein.

Figure 2:
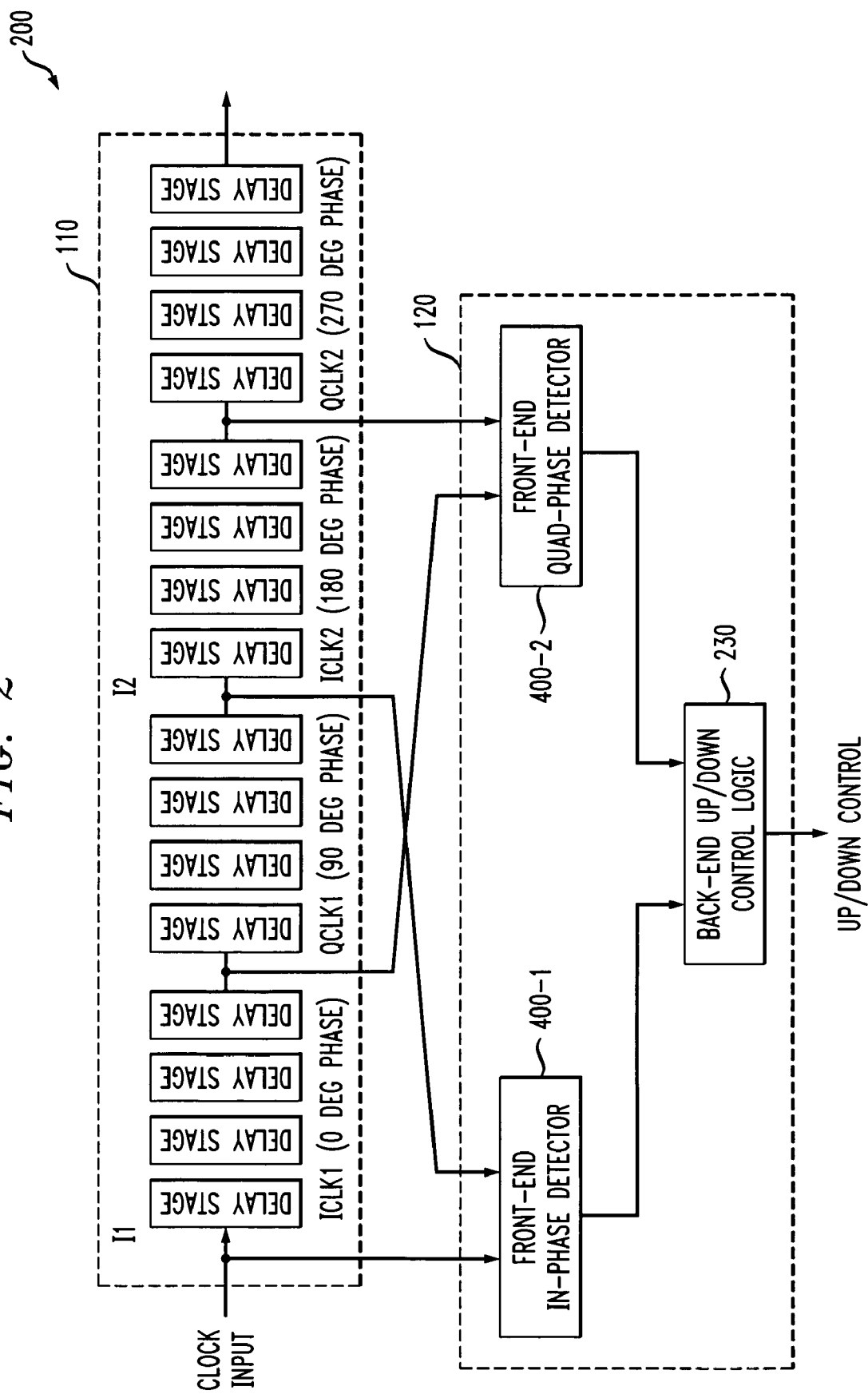
FIG. 2 is a schematic block diagram of a portion of a DLL circuit incorporating features of the present invention.

FIG. 2 is a schematic block diagram of a portion of DLL circuit 200 incorporating features of the present invention. As shown in FIG. 2, the DLL circuit 200 comprises the VCDL 110 of FIG. 1 and a phase detector 120. According to one aspect of the present invention, the phase detector 120 is comprised of a front-end in-phase detector 400-1 and a front-end quad-phase detector 400-2, discussed further below in conjunction with FIG. 4. In addition, the phase detector 120 includes a back-end up/down signal control circuit 230.

Figure 3:
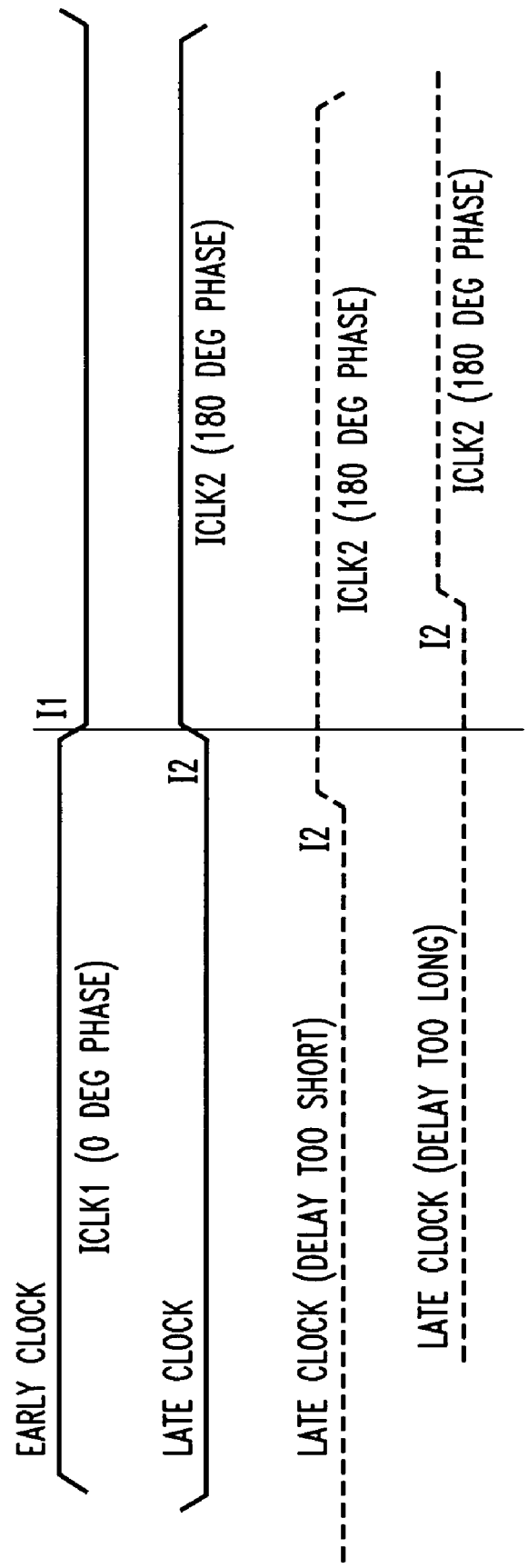
FIG. 3 illustrates clock signals ICLK1 and ICLK2 that are 180 degrees out of phase.

FIG. 3 illustrates two clock signals ICLK1 and ICLK2 that are 180 degrees out of phase. Generally, as shown in FIGS. 2 and 3, the 180 degree phase difference between the two clock signals ICLK1 and ICLK2 is achieved using a number of delay elements in the VCDL 110. The phase detector 120 determines the phase difference between falling edges of the early clock signal and rising edges of the late clock, each generated by the voltage controlled delay line 110 and generates an upward or downward control signal, U/D, indicating whether there is a phase lead or lag, respectively.

More specifically, the front-end in-phase detector 400-1 compares the phase of the two in-phase clock signals ICLK1 and ICLK2 that are 180 degrees out of phase. In addition, the front-end quad-phase detector 400-2 compares the phase of the two quadrature-phase clock signals QCLK1 and QCLK2 that are also 180 degrees out of phase.

The outputs of the front-end in-phase detector 400-1 and front-end quad-phase detector 400-2 are processed by the back-end up/down control logic circuit 230 to generate the upward or downward control signal, U/D, indicating whether there is a phase lead or lag, respectively.

As shown in FIG. 2, among other benefits, the present invention provides a trimming method that trims the paths at the point of measurement (within the front-end in-phase detector 400-1 and front-end quad-phase detector 400-2) to reduce the phase offset to approximately zero. As discussed further below, the present invention aligns the phases of the two clock signals applied to each of the front-end in-phase detector 400-1 and front-end quad-phase detector 400-2.

Figure 4:
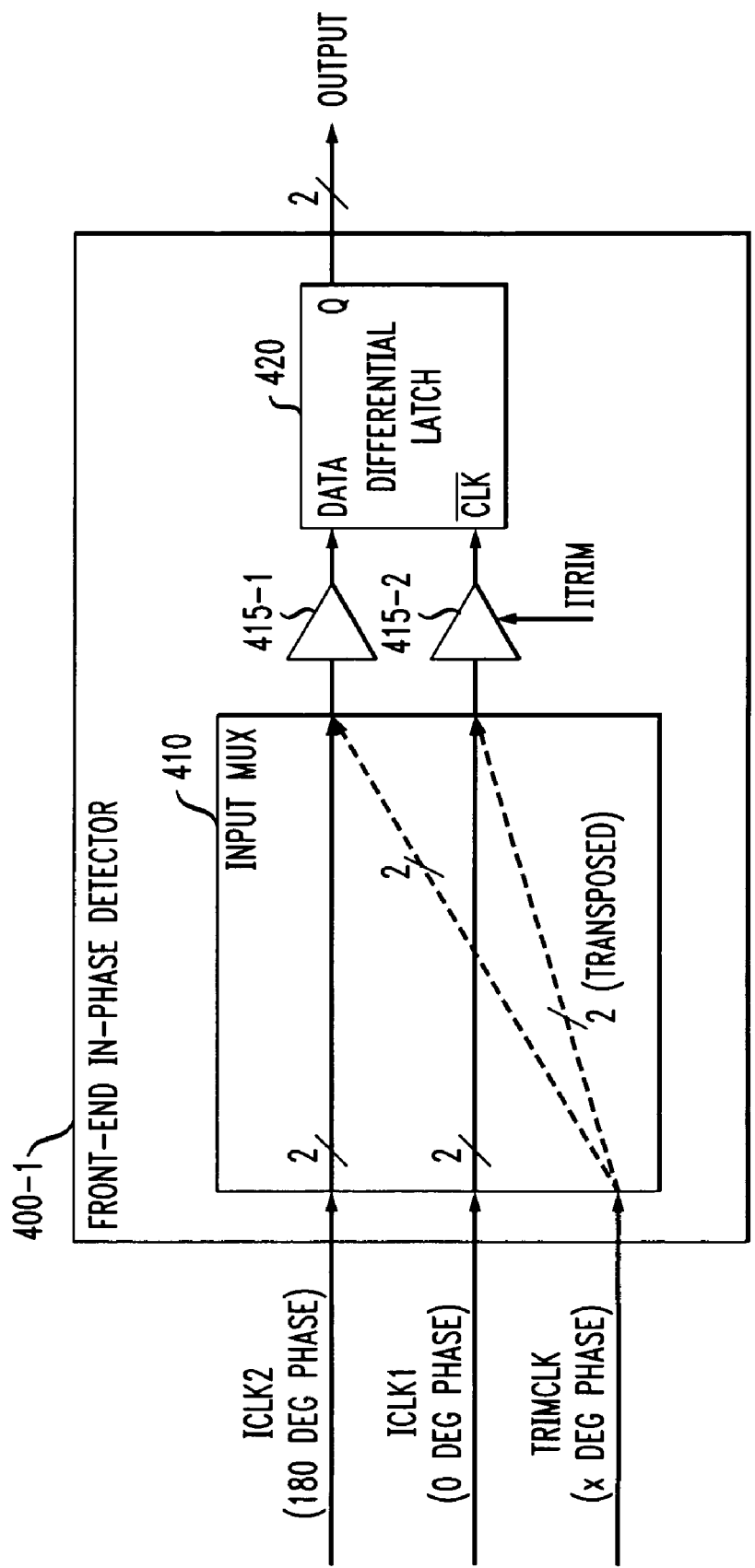
FIG. 4 is a schematic block diagram illustrating the front-end in-phase detector of FIG. 2 in further detail.

FIG. 4 is a schematic block diagram illustrating the front-end in-phase detector 400-1 of FIG. 2 in further detail. It is noted that the front-end quad-phase detector 400-2 of FIG. 2 is implemented in a similar manner, as would be apparent to a person of ordinary skill in the art. As shown in FIG. 4, in an operating mode, the two clock signals ICLK1 and ICLK2 are selected by a multiplexer 410, and applied to the data and clock bar inputs of a differential latch 420. As previously indicated, the differential latch 420 will compare the phases of the two applied signals and generate an output having magnitude that is proportional to the phase offset.

In a trim mode, in accordance with the present invention, the multiplexer 410 selects a trimclk signal and an inverted version of the trimclk signal, that are applied to the data and clock bar inputs of a differential latch 420. The trim control settings (ITRIM) of one or more of a pair of buffers 415-1 and 415-2 are adjusted in accordance with the present invention until the phase offset measured by the differential latch 420 is zero. In this manner, the phase offset at the point of measurement (at the differential latch 420 within the front-end in-phase detector 500-1 and front-end quad-phase detector 400-2) is reduced to approximately zero.

Figure 5:
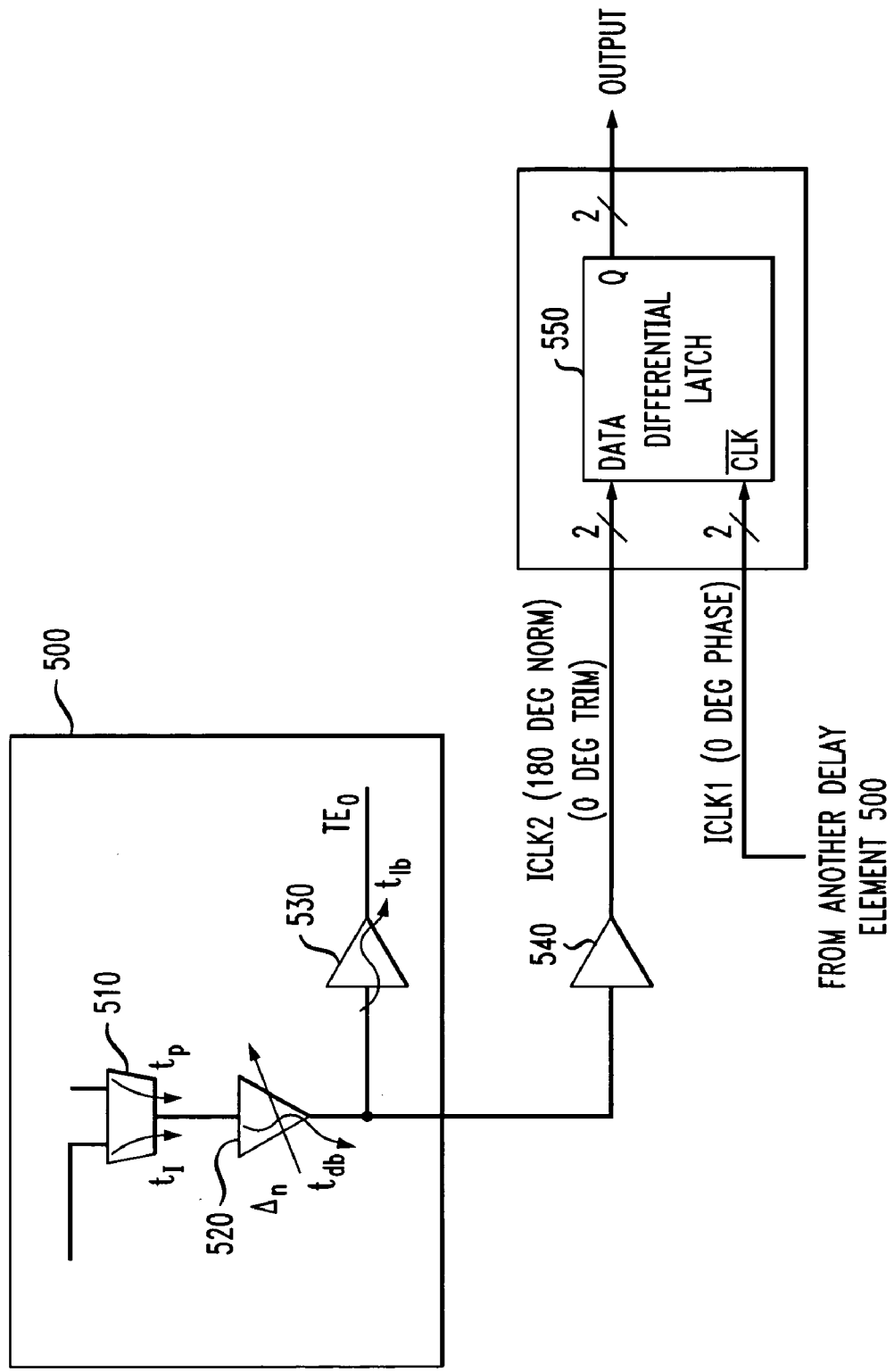
FIG. 5 illustrates an alternate implementation of the trimming method of the present invention using an exemplary delay element of the VCDL of FIG. 1 to provide a source of phase aligned data.

FIG. 5 is a block diagram illustrating an exemplary delay element 500 of the VCDL 110 of FIG. 2 in further detail. FIG. 5 illustrates an alternate implementation of the trimming method of the present invention. In particular, the implementation of FIG. 5 provides a parallel trim signal that can be used instead of the trimclk of FIG. 4.

As shown in FIG. 5, the delay element 500 comprises a multiplexer 510, a delay element 520 and a latch buffer 530. The multiplexer 510 selects the output of a central interpolator or the output of the previous delay element in the VCDL 110. Typically, in a normal operating mode, only one delay element 500 in the VCDL 110 selects the output of the central interpolator (i.e., the injection point) and the remaining delay elements 500 select the output of the previous delay element in the loop. For example, in a normal operation mode, the VCDL delay elements can provide 40 ps of delay. Ideally, these equally spaced delays provide high speed multi-phase sampling clocks derived out of a same speed clock source. In a parallel trim mode in accordance with the present invention, however, each delay element 500 in the VCDL 110 selects the output of a central interpolator.

It has been found that each delay element 500 will assert delays uncorrelated to other delay elements in the VCDL 110 giving rise to non-equal phase delays from one delay element 500 to another. In particular, the following parameters of a given delay element 500 may vary from another delay element as follows:

delay through regular MUX path (from previous delay element)=$t_p$;

delay through injection path (from central interpolator 120)=$t_j$;

delay through delay element 520=$t_{db}$; and delay through the latch buffer 530=$t_{lb}$.

U.S. patent application Ser. No. 11/020,022, entitled, "Trimming Method and Apparatus for Voltage Controlled Delay Loop with Central Interpolator," discloses methods and apparatus for trimming a desired delay element 520 in a voltage controlled delay loop (ensures that the delay provided by each delay element in the VCDL loop are the same). U.S. patent application Ser. No. 11/141,703, entitled, "Parallel Trimming Method and Apparatus for a Voltage Controlled Delay Loop," discloses a parallel trimming method and apparatus for a voltage controlled delay loop that trims the latch buffer 530 associated with each delay element 500. Generally, the parallel trimming method disclosed in U.S. patent application Ser. No. 11/141,703, matches the following delay path:

Parallel trim delay path=$t_{In}+t_{dbn}+t_{lbn}$

As discussed further below, the present invention provides a method for trimming the buffer 540 of each delay element 500 in a VCDL 110, such that the phase offset measured by the latch 550 in a trim mode is approximately zero.

In a parallel trim mode, the same clock is injected, for example, from the central interpolator, to each delay element 500. Once the parallel injection is enabled, the clock phases out of all delay elements 500 will be adjusted such that they are aligned to each other. The delay in all delay elements 520 and their associated multiplexers 510 and latch buffers 530 all contribute to the delay and can be equalized with respect to injection point of entry. It is assumed that the delay, $t_r$, through the injection point input to the multiplexers 510 and the regular delay input, $t_p$, to the MUX would be comparable. In the exemplary embodiment, it is assumed that the variation of the delay through the delay elements 520 and multiplexers 510 will be small. Thus, the disclosed parallel trim technique only trims the delay through buffer 540, but it can also compensate for the difference in delays through elements 510 and 520, as would be apparent to a person of ordinary skill in the art.

As shown in FIG. 5, the output of the buffer 540, as well as the output of another delay element that is 180 degrees out of phase, such as the two clock signals ICLK1 and ICLK2, are applied to a latch 550. The trim settings of the associated buffers 540 are adjusted in a trim mode until the phase offset measured by the latch 550 is approximately zero.

Note that in the parallel trim mode, the ICLK1 phase and ICK2 phase are 0 degrees apart. In non-trim mode the ICLK1 phase and ICLK2 phase are 180 degrees apart. This indicates two different measurement conditions. One skilled in the art can reduce the difference of the phase detector latch "set-up time to latch a logic one" and "set-up time to latch a logic zero" to nearly zero.

A plurality of identical die are typically formed in a repeated pattern on a surface of the wafer. Each die includes a device described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

It is to be understood that the embodiments and variations shown and described herein are merely illustrative of the principles of this invention and that various modifications may be implemented by those skilled in the art without departing from the scope and spirit of the invention.

The invention claimed is:

1. A method for trimming a phase detector comprised of a latch and one or more pre-latch buffers, wherein said latch evaluates a phase offset between two signals, said method comprising the steps of:
    applying two signals to said pre-latch buffets that are substantially phase aligned;
    obtaining a phase offset attributable to said phase detector between said two signals measured by said latch; and
    adjusting a trim setting of said one or more pre-latch buffers associated with said two signals until said phase offset satisfies one or more predefined criteria.

2. The method of claim 1, wherein said latch is within a phase detector in a delay-locked loop.

3. The method of claim 1, wherein said two signals are a clock signal and an inverted version of said clock signal.

4. The method of claim 1, wherein said two signals are a source of phase aligned data generated from a single clock source.

5. The method of claim 4, wherein said source of phase aligned data is obtained by aligning one or more edges of signals generated by delay elements that are 180 degrees out of phase.

6. The method of claim 5, wherein said one or more edges comprise a rising edge or a falling edge.

7. The method of claim 4, wherein said single clock source is a central interpolator in a clock and data recovery circuit.

8. The method of claim 1, wherein said obtaining step further comprises the step of applying said two signals to said latch and determining if edges associated with each of said two signals ate substantially aligned.

9. A delay-locked loop circuit, comprising:
    a phase detector comprising:
        at least one latch for determining a phase offset attributable to said phase detector between two signals that are substantially phase aligned;
        one or more pre-latch buffers associated with said two signals; and
        a trim control terminal for adjusting a trim setting of said one or more pre-latch buffers associated with said two signals until said phase offset satisfies one or more predefined criteria.

10. The delay-locked loop circuit of claim 9, wherein said two signals are a clock signal and an inverted version of said clock signal.

11. The delay-locked loop circuit of claim 9, wherein said two signals are a source of phase aligned data generated from a single clock source.

12. The delay-locked loop circuit of claim 11, wherein said source of phase aligned data is obtained by aligning one or more edges of signals generated by delay elements that are 180 degrees out of phase.

13. The delay-locked loop circuit of claim 12, wherein said one or more edges comprise a rising edge or a falling edge.

14. The delay-locked loop circuit of claim 11, wherein said single clock source is a central interpolator in a clock and data recovery circuit.

15. The delay-locked loop circuit of claim 9, wherein said phase offset is determined by applying said two signals to said latch and determining if edges associated with each of said two signals are substantially aligned.

16. An integrated circuit, comprising:
    a delay-locked loop, comprising:
        a phase detector comprising:
            at least one latch for determining a phase offset attributable to said phase detector between two signals that are substantially phase aligned;
            one or more pre-latch buffers associated with said two signals; and
            a trim control terminal for adjusting a trim setting of said one or more pre-latch buffers associated with said two signals until said phase offset satisfies one or more predefined criteria.

17. The integrated circuit of claim 16, wherein said two signals are a clock signal and an inverted version of said clock signal.

18. The integrated circuit of claim 16, wherein said two signals are a source of phase aligned data generated from a single clock source.

19. The integrated circuit of claim 18, wherein said source of phase aligned data is obtained by aligning one or more edges of signals generated by delay elements that are 180 degrees out of phase.

20. The integrated circuit of claim 18, wherein said single clock source is a central interpolator in a clock and data recovery circuit.

* * * * *